(12) United States Patent
Roberts et al.

(10) Patent No.: US 12,237,546 B2
(45) Date of Patent: Feb. 25, 2025

(54) BRIDGED BATTERY PACK SENSING MODULE FOR MULTIPLE ARRAYS

(71) Applicant: FORD GLOBAL TECHNOLOGIES, LLC, Dearborn, MI (US)

(72) Inventors: Daniel Paul Roberts, Livonia, MI (US); Francisco Fernandez-Galindo, Canton, MI (US); Liam E. West, Ferndale, MI (US); Dominic Mario Bertolini, Royal Oak, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 167 days.

(21) Appl. No.: 17/951,814

(22) Filed: Sep. 23, 2022

(65) Prior Publication Data
US 2024/0106095 A1    Mar. 28, 2024

(51) Int. Cl.
| | |
|---|---|
| *H01M 50/569* | (2021.01) |
| *B60L 50/64* | (2019.01) |
| *B60L 58/18* | (2019.01) |
| *G01R 31/3835* | (2019.01) |
| *G01R 31/396* | (2019.01) |
| *H01M 10/48* | (2006.01) |
| *H01M 50/204* | (2021.01) |
| *H01M 50/519* | (2021.01) |
| *H05K 1/02* | (2006.01) |
| *H05K 1/14* | (2006.01) |

(52) U.S. Cl.
CPC ........... *H01M 50/569* (2021.01); *B60L 50/64* (2019.02); *B60L 58/18* (2019.02); *G01R 31/3835* (2019.01); *G01R 31/396* (2019.01); *H01M 10/482* (2013.01); *H01M 50/204* (2021.01); *H01M 50/519* (2021.01); *H05K 1/0268* (2013.01); *H05K 1/147* (2013.01); *H01M 2220/20* (2013.01)

(58) Field of Classification Search
CPC ............... H01M 50/569; G01R 31/396; G01R 31/3835
See application file for complete search history.

(56) References Cited

U.S. PATENT DOCUMENTS

| | | |
|---|---|---|
| 9,267,993 B2 | 2/2016 | Farmer et al. |
| 9,869,726 B2 | 1/2018 | Zumstein et al. |
| 10,992,327 B2 | 4/2021 | Hou et al. |

(Continued)

FOREIGN PATENT DOCUMENTS

| | | |
|---|---|---|
| CN | 105904992 B | 8/2018 |
| CN | 105437989 B | 1/2021 |

(Continued)

*Primary Examiner* — Minh Q Phan
(74) *Attorney, Agent, or Firm* — David B. Kelley; Brooks Kushman P.C.

(57) ABSTRACT

A battery pack sensing module includes a rigid printed circuit board that is to be carried by and bridge between a pair of battery cell arrays, a plurality of integrated circuits mounted on the rigid printed circuit board, and a pair of sense lead connectors at opposite ends of the rigid printed circuit board. Each of the sense lead connectors is electrically connected with at least one of the integrated circuits and can mate with a receiving connector of one of the battery cell arrays to establish an electrical connection between the receiving connector and the at least one of the integrated circuits.

7 Claims, 4 Drawing Sheets

(56) References Cited

U.S. PATENT DOCUMENTS

2020/0091494 A1\* 3/2020 Fernandez-Galindo ...................... G01R 31/36
2023/0012192 A1\* 1/2023 Park .................... H01M 50/284
2023/0084184 A1\* 3/2023 Yamamoto .......... H01M 50/209
429/90

FOREIGN PATENT DOCUMENTS

| | | | | |
|---|---|---|---|---|
| CN | 212625744 U | 2/2021 | | |
| EP | 2475066 A1 \* | 7/2012 | .......... | B60L 11/1866 |
| KR | 20180111314 A | 10/2018 | | |

\* cited by examiner

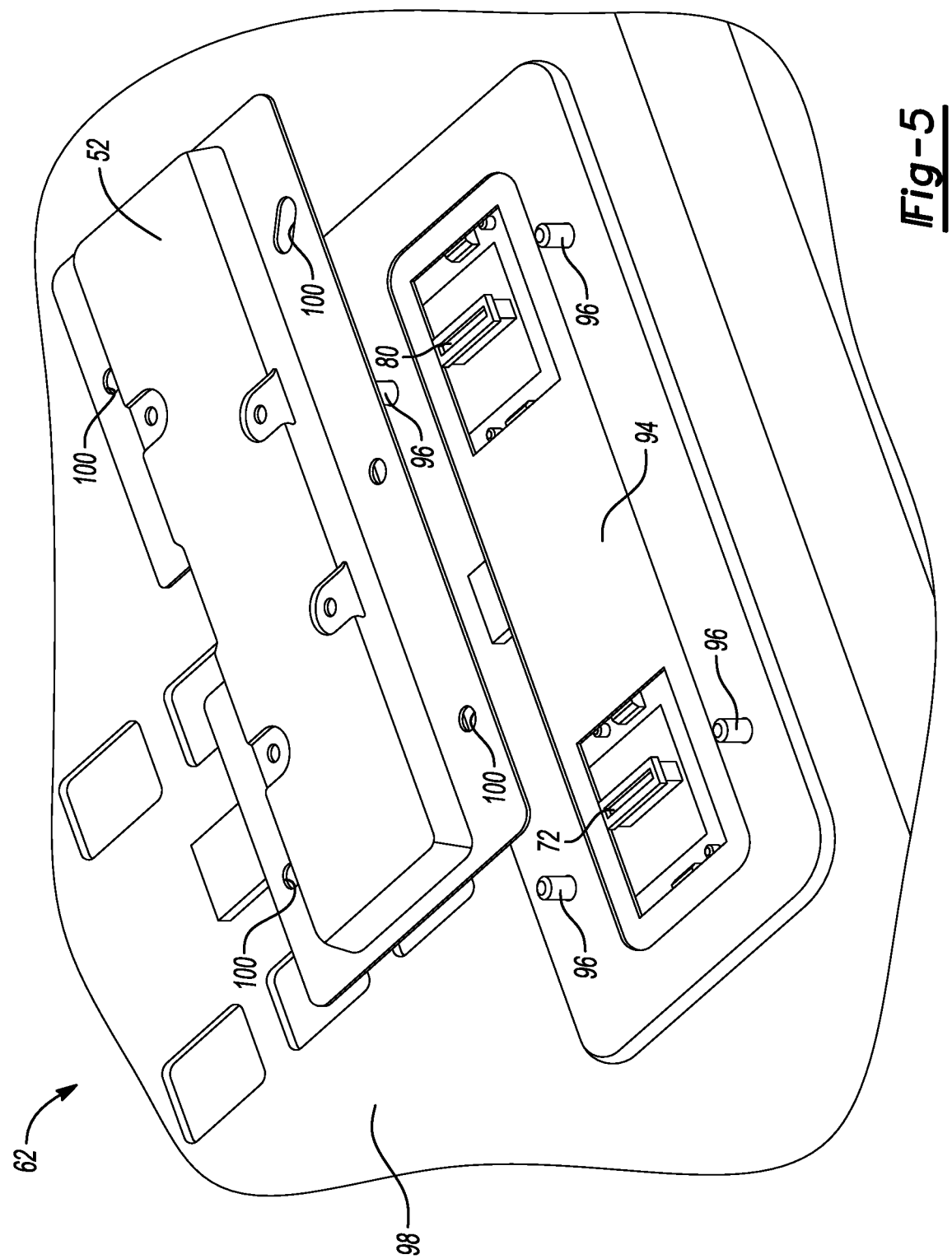

BRIDGED BATTERY PACK SENSING MODULE FOR MULTIPLE ARRAYS

TECHNICAL FIELD

This disclosure relates to vehicle power systems and components thereof.

BACKGROUND

Automotive vehicles may be propelled via electrical power supplied from a traction battery assembly to an electric machine that converts the electrical power to mechanical power. The traction battery assembly may include multiple arrays, or other types, of battery cell sub-assemblies. Sensors may be used to collect data about battery cells of the battery cell sub-assemblies.

SUMMARY

A traction battery assembly includes a pair of battery cell arrays disposed adjacent to one another, each of the battery cell arrays including a plurality of cells, flexible printed circuit boards electrically connected with voltage sense leads associated with the cells, and a receiving connector electrically connected with at least one of the flexible printed circuit boards. The traction battery assembly further includes a rigid printed circuit board carried by and bridging between the battery cell arrays, a plurality of integrated circuits mounted on the rigid printed circuit board, and a pair of sense lead connectors at opposite ends of the rigid printed circuit board. Each of the sense lead connectors is electrically connected with at least one of the integrated circuits and mates with one of the receiving connectors to establish an electrical connection between the at least one of the flexible printed circuit boards and the at least one of the integrated circuits.

At least one of the sense lead connectors may extend through and away from the rigid printed circuit board. The traction battery assembly may further include an additional flexible printed circuit board electrically connecting the rigid printed circuit board and one of the sense lead connectors. The traction battery assembly may further include no more than one interface connector electrically connected with the integrated circuits and mounted on the rigid printed circuit board. The traction battery assembly may further include a case defining a cavity occupied by the rigid printed circuit board and integrated circuits. At least one of the battery cell arrays may include bracketry defining locating pins that project through the exterior surface and a flange of the case to locate the case relative to the at least one of the battery cell arrays. The bracketry may span between the battery cell arrays. The traction battery assembly may further include a center wall between the battery cell arrays. The bracketry may further define additional pins extending into the center wall to prevent rotation of the bracketry relative to the center wall. The receiving connector may be recessed relative to an exterior surface of the battery cell arrays.

A battery pack sensing module includes a rigid printed circuit board that is to be carried by and bridge between a pair of battery cell arrays, a plurality of integrated circuits mounted on the rigid printed circuit board, and a pair of sense lead connectors at opposite ends of the rigid printed circuit board. Each of the sense lead connectors is electrically connected with at least one of the integrated circuits and can mate with a receiving connector of one of the battery cell arrays to establish an electrical connection between the receiving connector and the at least one of the integrated circuits.

At least one of the sense lead connectors may extend through and away from the rigid printed circuit board. The battery pack sensing module may further include flexible printed circuit board electrically connecting the rigid printed circuit board and one of the sense lead connectors. The battery pack sensing module may further include no more than one interface connector electrically connected with the integrated circuits and mounted on the rigid printed circuit board. The battery pack sensing module may further include a case defining a cavity occupied by the rigid printed circuit board and integrated circuits. The case may define a flange defining a plurality of locating features that locate the case relative to the battery cell arrays.

A battery pack includes a pair of battery cell arrays disposed adjacent to one another, each of the battery cell arrays including a plurality of cells, flexible printed circuit boards electrically connected with voltage sense leads associated with the cells, and a receiving connector electrically connected with at least one of the flexible printed circuit boards. The battery pack further includes a center wall disposed between the battery cell arrays, and bracketry spanning between the battery cell arrays and over the center wall. The bracketry includes locating pins that project through an exterior surface of the battery cell arrays and are arranged to locate a battery pack sensing module that spans between the battery cell arrays relative to the battery cell arrays.

The bracketry may further include additional pins that extend into the center wall to prevent rotation of the bracketry relative to the center wall. The receiving connector may be recessed relative to an exterior surface of the battery cell arrays.

BRIEF DESCRIPTION OF THE DRAWINGS

In the following detailed description, reference is made to the accompanying figures, which form a part thereof, and in which are shown by way of illustration specific embodiments. Other embodiments, of course, are also contemplated and/or described.

FIGS. 4 and 5 are perspective views of the battery assemblies of FIG. 3B.

DETAILED DESCRIPTION

Figure 1:
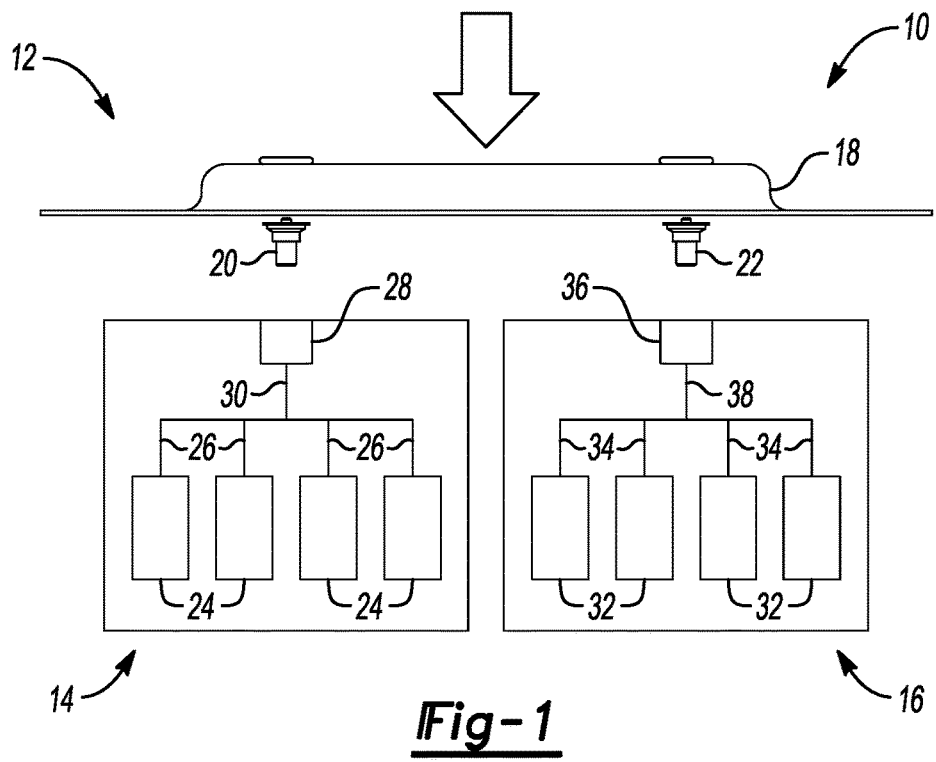
FIG. 1 is a block diagram of an example traction battery assembly.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Due to cell count increases on some electric vehicle battery packs, multiple corresponding battery pack sensing modules, instead of a single battery pack sensing module, may be required. It may be desirable, however, to reduce battery pack sensing module counts.

Some battery pack sensing modules use a single board-to-board connection system mounted on a particular type of board, and the mating side on a board stiffener on the array side. This arrangement may require an individual battery pack sensing module for each array stack, potentially multiple per array. If a larger battery pack sensing module were made, it may need to connect to multiple arrays. Connecting multiple arrays together in such a configuration may require robust tolerance design for sense lead connector placement variation.

Higher battery pack series cell counts could thus be handled by using a single larger battery pack sensing module. Such a battery pack sensing module may have multiple battery monitoring integrated circuits and bridge across two arrays or cell stacks. Due to this bridge design, large arrays designed with multiple cell stacks can have a single battery pack sensing module mounting strategy. A single battery pack sensing module could simplify the design architecture with the corresponding arrays and meet packaging requirements while minimizing resistance values. A single battery back sensing module could also eliminate at least one pack interface connector and relax requirements for tight tolerances to ensure a seamless array assembly process.

In some examples, the battery pack sensing module assembly would have one pack interface connector and two sense lead connectors linked to the battery pack sensing module board by flexible printed circuit board allowing more flexibility for assembly and requiring less precise tolerances.

Mounting the proposed battery pack sensing modules to corresponding hardware could introduce blind operations for connector insertion. These battery back sensing modules could also be subject to tolerance stack-up issues, stress on soldered connectors, and vibration. An internal array bridge bracket may thus also be introduced.

The bridge bracket, in certain examples, is a molded plastic assembly that sits on top of both battery assemblies (one per sub-array), and can provide a mounting surface for the individual flexible printed circuit boards and connector stiffener boards that originate from each sub-array. The bridge bracket may have integrated studs and locating pins that protrude through the array cover to guide the battery pack sensing module alignment. It may also have downward-facing pegs that engage with the center wall between the sub-arrays to align components during array assembly. The bridge bracket thus enables direct alignment from the array internal components to the battery pack sensing module assembly.

Referring to FIG. 1, a traction battery assembly 10 includes a battery pack sensing module 12 and a pair of battery arrays 14, 16 that are adjacent to each other. The battery pack sensing module 12 includes, among other things, a case 18 and a pair of sense lead connectors 20, 22 rigidly connected at opposite ends of the battery pack sensing module 12. The battery array 14 includes a plurality of battery cells 24 each having a voltage sense lead 26 extending therefrom, a receiving connector 28 recessed within a case of the battery array 14, and flexible printed circuit board 30 electrically connecting the voltage sense leads 26 and the receiving connector 28. The battery array 16 includes a plurality of battery cells 32 each having a voltage sense lead 34 extending therefrom, a receiving connector 36 recessed within a case of the battery array 16, and flexible printed circuit board 38 electrically connecting the voltage sense leads 34 and the receiving connector 36.

The battery pack sensing module 12 is carried by and spans between the battery arrays 14, 16 such that the sense lead connector 20 engages the receiving connector 28, and the sense lead connector 22 engages the receiving connector 36.

Figure 2:
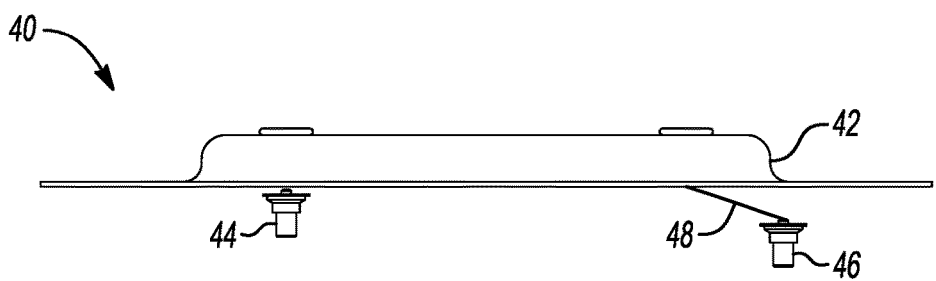
FIG. 2 is a block diagram of an example battery pack sensing module.

Referring to FIG. 2, a battery pack sensing module 40 includes, among other things, a case 42, a pair of sense lead connectors 44, 46 at opposite ends of the battery pack sensing module 40, and a flexible printed circuit board 48. The sense lead connector 44 is rigidly connected at an end of the battery pack sensing module 40. The sense lead connector 46 is flexibly connected at another end of the battery pack sensing module 40 via the flexible printed circuit board 48.

Figure 3A:
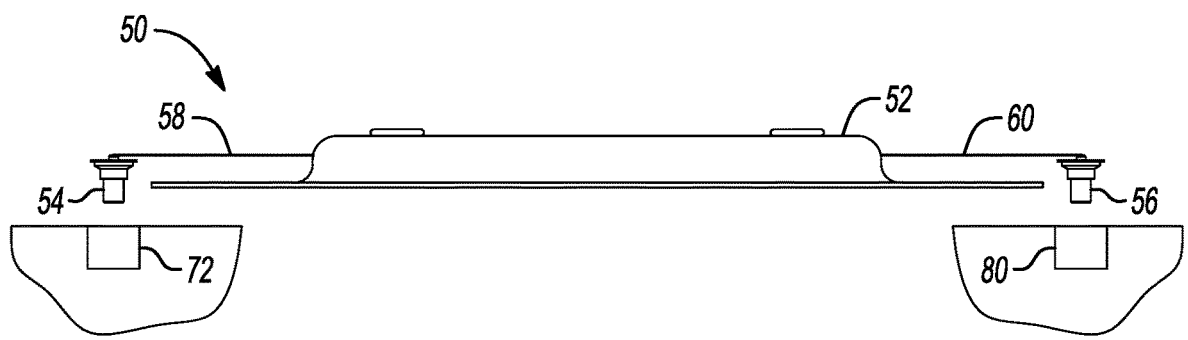
FIGS. 3A and 3B are block diagrams of another example traction battery assembly.

Referring to FIG. 3A, a battery pack sensing module 50 includes, among other things, a case 52, a pair of sense lead connectors 54, 56 at opposite ends of the battery pack sensing module 50, and a flexible printed circuit boards 58, 60 flexibly connected at opposite ends of the battery pack sensing module 50 via the flexible printed circuit boards 58, 60.

Figure 3B:
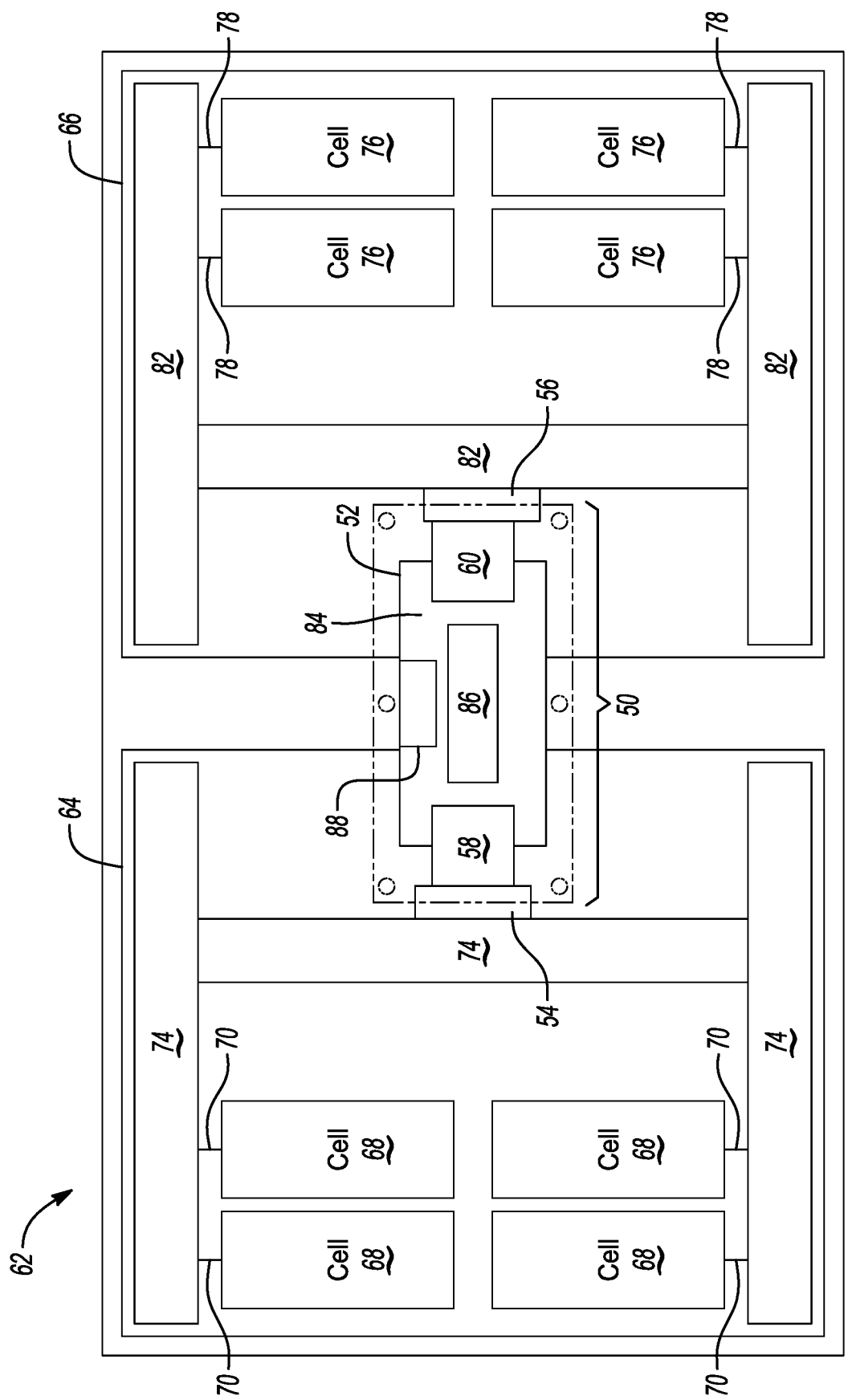

Referring to FIG. 3B, a traction battery assembly 62 includes the battery pack sensing module 50 and a pair of battery arrays 64, 66 that are adjacent to each other. The battery array 64 includes a plurality of battery cells 68 each having a voltage sense lead 70 extending therefrom, a receiving connector 72 (FIG. 3A) recessed within a case of the battery array 14, and flexible printed circuit board 74 electrically connecting the voltage sense leads 70 and the receiving connector 72. The battery array 66 includes a plurality of battery cells 76 each having a voltage sense lead 78 extending therefrom, a receiving connector 80 recessed within a case of the battery array 66, and flexible printed circuit board 82 electrically connecting the voltage sense leads 78 and the receiving connector 82.

The battery pack sensing module 50 is carried by and spans between the battery arrays 64, 66 such that the sense lead connector 54 engages the receiving connector 72, and the sense lead connector 56 engages the receiving connector 80. The battery pack sensing module 50 further includes a rigid printed circuit board 84 carried by and bridging between the battery arrays 64, 66, a plurality of integrated circuits 86 mounted on the printed circuit board 84 and electrically connected with the flexible printed circuit boards 58, 60, and a single pack interface connector 88 electrically connected with the integrated circuits 86.

Figure 4:
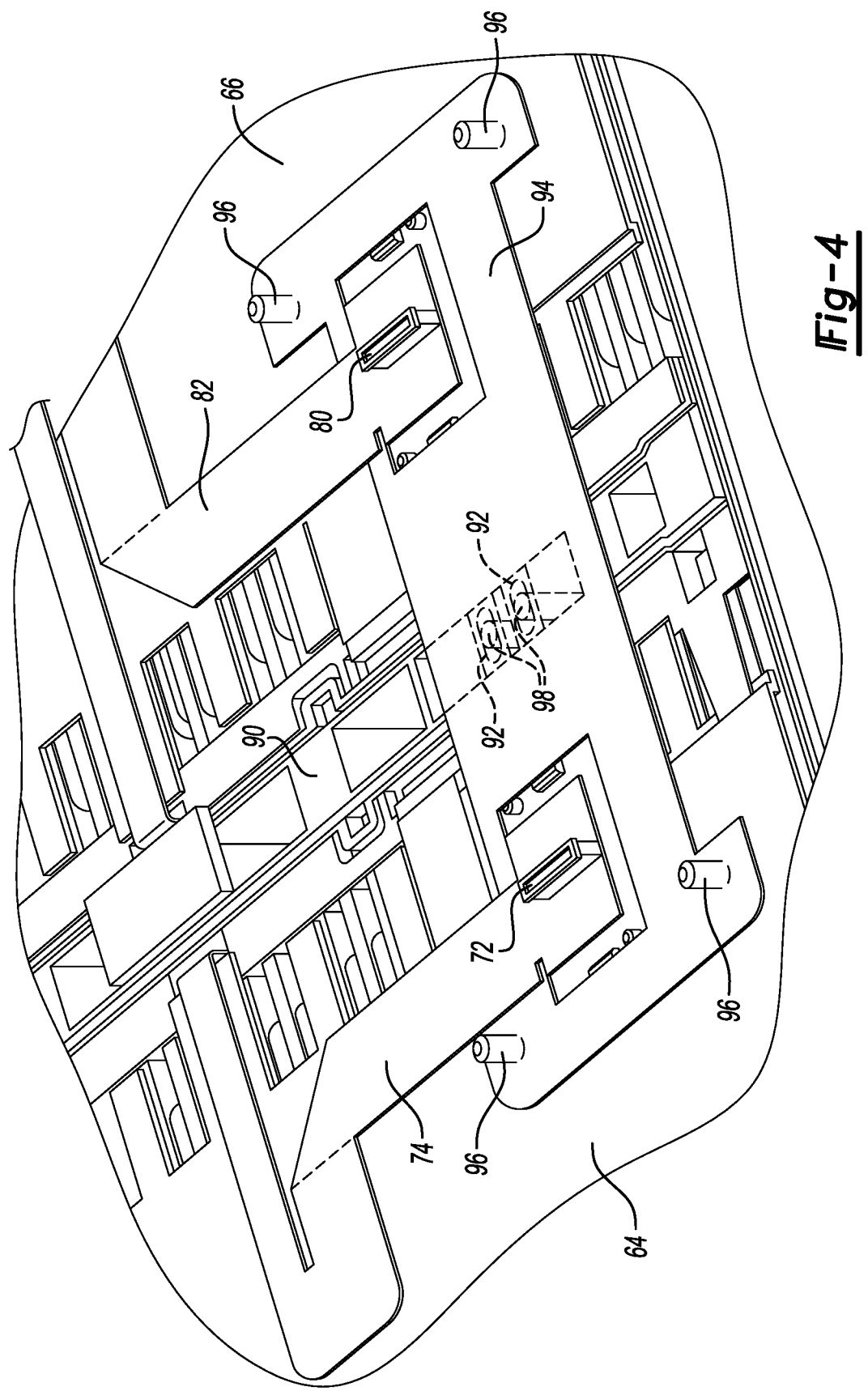

Referring to FIG. 4, the battery arrays 64, 66 have disposed between them a center wall 90 that defines a plurality of cavities 92 therein, and have thereon a bracket 94 that spans between them. The bracket 94 includes a plurality of locating pins 96 that project away from the battery arrays 64, 66 and toward the battery pack sensing module 50, and a plurality of additional pins 98 that project toward the center wall 90. The locating pins 94 are on opposite ends of the bracket 94 and provide features that cooperate with the case 52 to locate the battery pack sensing module 50 relative to the battery arrays 64, 66. The additional pins 98 engage the cavities 92 to prevent the bracket 94 from rotating relative to the battery arrays 64, 66.

Referring to FIG. 5, the traction battery assembly 62 further includes a cap 98 that covers the battery arrays 64, 66 and center wall 90, and the case 52 defines a plurality of holes 100 around a perimeter thereof. The cavity defined by the case 52 contains the sense lead connectors 54, 56, flexible printed circuit boards 58, 60, rigid printed circuit board 84, integrated circuits 86, and pack interface connector 88. The locating pins 96 extend through and away from the cap 96 and engage the holes 100.

While exemplary embodiments are described above, it is not intended that these embodiments describe all possible forms encompassed by the claims. In the illustrated examples for example, the sense lead connectors extend away from the battery pack sensing module and the receiving connectors are recessed within the cases of the battery arrays. In other examples, the sense lead connectors may be recessed within a case of the battery sensing module and the receiving connectors may extend away from the battery arrays. The bracketry in the illustrated examples is relatively planar in construction. It may, however, resemble a scaffold or other support structure, etc.

The words used in the specification are words of description rather than limitation, and it is understood that various changes may be made without departing from the spirit and scope of these disclosed materials.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A traction battery assembly comprising:
   a pair of battery cell arrays disposed adjacent to one another, each of the battery cell arrays including a plurality of cells, flexible printed circuit boards electrically connected with voltage sense leads associated with the cells, and a receiving connector electrically connected with at least one of the flexible printed circuit boards;
   a rigid printed circuit board carried by and bridging between the battery cell arrays;
   a plurality of integrated circuits mounted on the rigid printed circuit board;
   a pair of sense lead connectors at opposite ends of the rigid printed circuit board, each of the sense lead connectors electrically connected with at least one of the integrated circuits and configured to mate with one of the receiving connectors to establish an electrical connection between the at least one of the flexible printed circuit boards and the at least one of the integrated circuits;
   a case defining a cavity occupied by the rigid printed circuit board and integrated circuits, wherein at least one of the battery cell arrays includes bracketry defining locating pins that project through an exterior surface and a flange of the case to locate the case relative to the at least one of the battery cell arrays and wherein the bracketry spans between the battery cell arrays; and
   a center wall between the battery cell arrays, wherein the bracketry further defines additional pins extending into the center wall to prevent rotation of the bracketry relative to the center wall.

2. The traction battery assembly of claim 1, wherein at least one of the sense lead connectors extends through and away from the rigid printed circuit board.

3. The traction battery assembly of claim 1 further comprising an additional flexible printed circuit board electrically connecting the rigid printed circuit board and one of the sense lead connectors.

4. The traction battery assembly of claim 1 further comprising no more than one interface connector electrically connected with the integrated circuits and mounted on the rigid printed circuit board.

5. The traction battery assembly of claim 1, wherein the receiving connector is recessed relative to an exterior surface of the battery cell arrays.

6. A battery pack comprising:
   a pair of battery cell arrays disposed adjacent to one another, each of the battery cell arrays including a plurality of cells, flexible printed circuit boards electrically connected with voltage sense leads associated with the cells, and a receiving connector electrically connected with at least one of the flexible printed circuit boards;
   a center wall disposed between the battery cell arrays; and
   bracketry spanning between the battery cell arrays and over the center wall, and including (i) locating pins that project through an exterior surface of the battery cell arrays and are configured to locate a battery pack sensing module that spans between the battery cell arrays relative to the battery cell arrays and (ii) additional pins that extend into the center wall to prevent rotation of the bracketry relative to the center wall.

7. The battery pack of claim 6, wherein the receiving connector is recessed relative to an exterior surface of the battery cell arrays.

* * * * *